United States Patent [19]
Schlager et al.

[11] Patent Number: 5,514,939
[45] Date of Patent: May 7, 1996

[54] CIRCUITRY FOR SWITCHING THE BODY NODES OF DRIVER TRANSISTORS IN DRIVE CIRCUITRY FOR BRUSHLESS DC MOTORS

[75] Inventors: Karl M. Schlager, Campbell; Francesco Carobolante, Portola Valley, both of Calif.; Solomon K. Ng, Singapore, Singapore

[73] Assignee: SGS-Thomson Microelectronics, Inc., Carrollton, Tex.

[21] Appl. No.: 330,382

[22] Filed: Oct. 27, 1994

[51] Int. Cl.$^6$ ............................................. H02P 7/00
[52] U.S. Cl. ............................................. 318/254; 318/439
[58] Field of Search ............................... 318/254, 138, 318/439, 253

[56] References Cited

U.S. PATENT DOCUMENTS

| | | | |
|---|---|---|---|
| 4,472,664 | 9/1984 | Chung | 318/138 |
| 4,879,498 | 11/1989 | Shinohara et al. | 318/254 |
| 5,017,845 | 5/1991 | Carbolante et al. | 318/138 |
| 5,191,269 | 3/1993 | Carbolante | 318/254 |
| 5,200,675 | 4/1993 | Woo | 318/254 |
| 5,202,616 | 4/1993 | Peters et al. | 318/254 |
| 5,306,988 | 4/1994 | Carobolante et al. | 318/254 |
| 5,378,975 | 1/1995 | Schweid et al. | 318/254 X |

*Primary Examiner*—Jonathan Wysocki
*Attorney, Agent, or Firm*—Rodney M. Anderson; Lisa K. Jorgenson; Richard K. Robinson

[57] ABSTRACT

Circuitry for selectably connecting the body node of drive transistors of a motor control circuit. In particular, those transistors that are turned off when operating the motor in a unipolar mode have their body nodes switched so as to be connected to a reference voltage, such as ground, during unipolar mode, and to be connected to the transistor source during bipolar mode (i.e., when the transistors are active). The circuitry also is operable to briefly connect the body nodes of the transistors to their source when the opposing drive transistor is commutated, in the unipolar mode. In this way, forward biasing of inherent diodes in the drive transistor is avoided in unipolar mode, except when useful to clamp the inductive kick of the motor coils.

19 Claims, 6 Drawing Sheets

CIRCUITRY FOR SWITCHING THE BODY NODES OF DRIVER TRANSISTORS IN DRIVE CIRCUITRY FOR BRUSHLESS DC MOTORS

This invention is in the field of motor control, and is more particularly directed to control of driver circuitry therefor.

BACKGROUND OF THE INVENTION

As is known in the art, DC brushless motors may be driven according to different modes, generally depending upon the speed of the motor. For example, a brushless DC motor may be operated in a bipolar mode (i.e., with two coils driven in each phase) during startup. Once a desired operating speed is reached, the motor drive circuitry may switch to a unipolar mode (i.e., only one coil driven in each phase), to reduce the effects of back emf induction in the driven coils at higher rotational speeds. As is known in the art, back emf in a driven coil reduces the available driving voltage that can be applied to the coil, which reduces the drive current to the coil and thus limits the torque of the motor.

Figure 1:
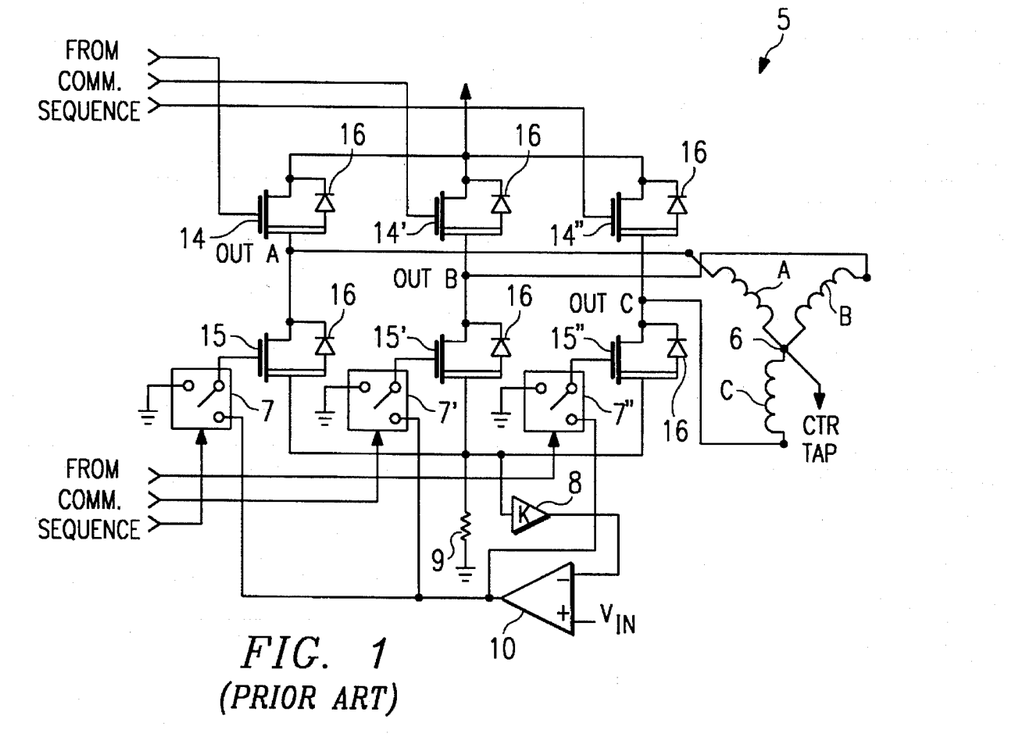
FIG. 1 is an electrical diagram, in schematic form, of a conventional driver control circuit and motor coils.

Referring now to FIG. 1, a typical arrangement of output driver transistors is illustrated hereof. In this example, which is described in detail in U.S. Pat. No. 5,306,988, issued Apr. 26, 1994, assigned to SGS-Thomson Microelectronics, Inc. and incorporated herein by this reference, a brushless DC motor includes stator (or, alternatively, rotor) coils A, B, C connected to a center tap 6 in the conventional "Y" arrangement. Driver circuit 5 includes, for each of motor coils A, B, C, an n-channel high-side drive, or pull-up, transistor 14 and an n-channel low-side drive, or pull-down, transistor 15. The gates of high-side drive transistors 14, 14', 14" (for motor coils A, B, C, respectively) are driven by lines from a commutation sequencer. The gates of low-side drive transistors 15, 15', 15" (for motor coils A, B, C, respectively), are driven by a respective power switch 7, 7', 7", under control of the commutation sequencer. Sensing resistor 9 is connected between the sources of low-side transistors 15, 15', 15" and ground; the voltage across resistor 9 is amplified by constant gain circuit 8, and applied to error amplifier 10 along with a reference voltage $V_{IN}$. The output of error amplifier 10, which is a voltage proportional to the differential voltage at its inputs, is provided to each of power switches 7, 7', 7". During a commutation sequence, the one of low-side transistors 15 that is to be turned on will have the output voltage of error amplifier 10 applied to its gate. As such, the current sensed by resistor 9 determines the amount of low side drive applied by driver circuit 5.

High-side drive transistors 14 and low-side drive transistors 15 in the arrangement of FIG. 1 each include a diode 16 having its anode connected to the transistor source and its cathode connected to the transistor drain. These diodes 16 arise from the body node-to-source connection of transistors 14, 15, resulting in diode 16 present at the p-n junction between the body node and drain for each of transistors 14, 15.

Figure 2:
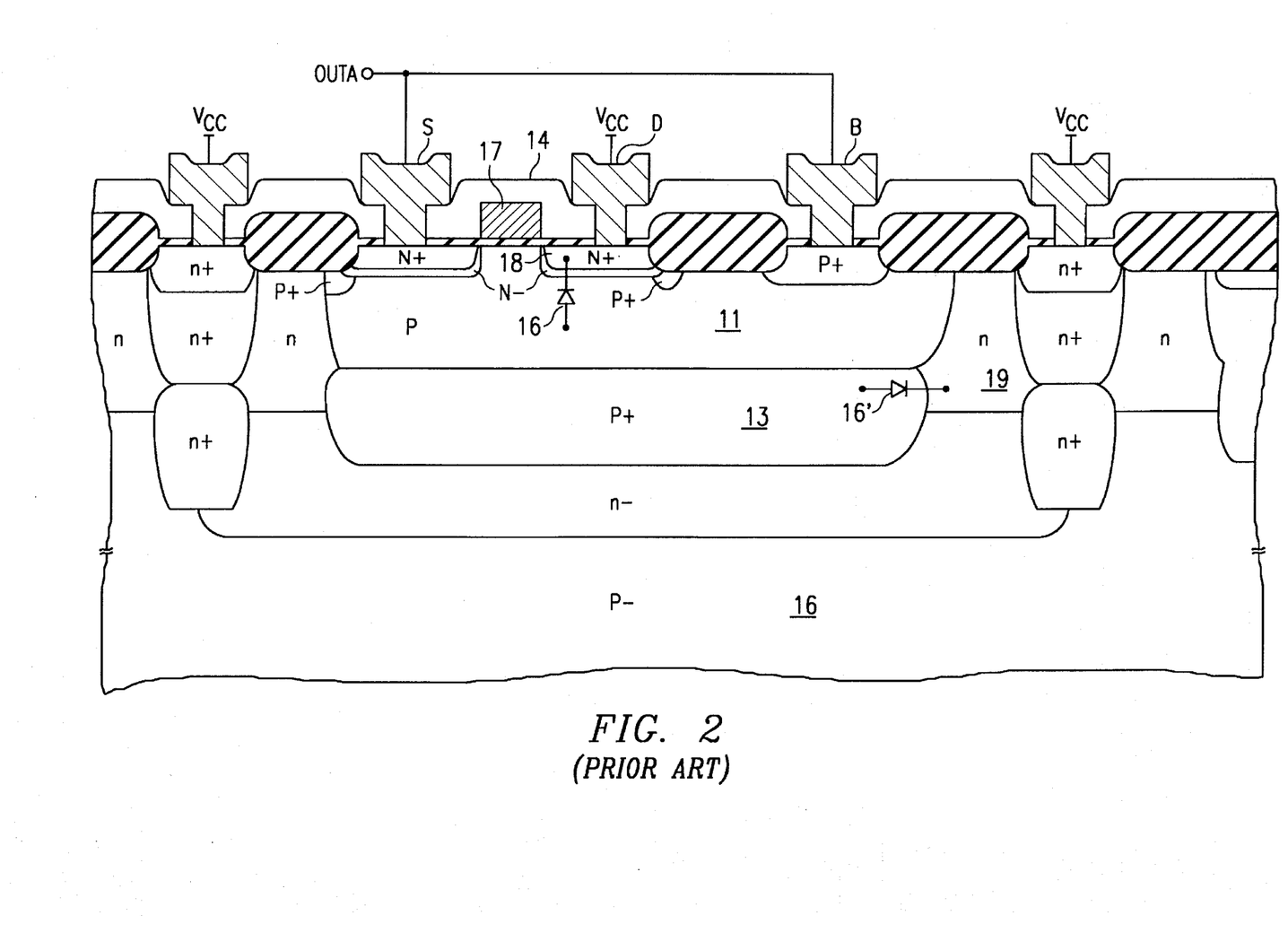
FIG. 2 is a cross-sectional diagram of a drive transistor in the circuit of FIG. 1, illustrating the location of intrinsic diodes therein.

By way of example, FIG. 2 illustrates, in cross-section, the construction of a typical n-channel drive transistor such as high-side drive transistor 14 of FIG. 1. As shown in FIG. 2, transistor 14 includes a source electrode S connected to an n+ source region, a drain electrode D connected to n+ source region 18, and gate electrode 17 overlying a channel region in p-well 11 therebetween. P-well 11 is connected to body electrode B through a surface p+ region and, as shown in FIG. 2, body electrode B is electrically connected to source electrode S, and to node OUTA of FIG. 1. Diode 16 for transistor 14 of FIG. 2 is thus present at the p-n junction between p-well 11 and n+ drain region 18.

In the configuration of FIG. 2, another diode 16' is also present at the p-n junction between buried p+ region 13 (underlying p-well 11) and n-type isolation region 19. N-type isolation region 19 is connected to the positive power supply $V_{cc}$ via an n+ region and a metal electrode, and serves to isolate p-well 11 from adjacent wells.

The body node-to-source connection of high-side drive transistors 14 provide rapid drive response to commutation in bipolar mode. This rapid response is due to the reduced threshold voltage for transistors 14 relative to that which would be present if body nodes of transistors 14 were biased to ground; in addition, the source/drain "on" resistance of transistors 14 is reduced in this configuration as compared to the case where the body node is biased to ground.

It has been observed, however, that the biasing of the body node to the source of high-side drive transistors 14 is undesirable in unipolar mode, however, due to the presence of diode 16 (and also diode 16' to the isolation regions, as discussed above). This is because the back emf of a coil, when floating in unipolar mode, may rise above the $V_{cc}$ power supply voltage. For each of coils A, B, C, this condition will forward bias diodes 16, 16' of FIG. 2 associated with its high-side drive transistor 14, 14', 14", respectively, and will short out the motor.

It is therefore an object of the present invention to provide a motor driver circuit in which the driver transistor body nodes may be biased in the most advantageous way in each operating mode.

It is a further object of the present invention to provide such a circuit in which the inductive kick at commutation is clamped.

Other objects and advantages of the present invention will be apparent to those of ordinary skill in the art having reference to the following specification, together with its drawings.

SUMMARY OF THE INVENTION

The present invention may be implemented in a motor driver circuit which switches the bias of the body node for driver transistors that are disabled in unipolar mode. According to the present invention, the body node is maintained at a reference voltage (e.g., ground) during all periods of the unipolar commutation sequence except during commutation, at which time the body node is connected to the source of the disabled drive transistor. In this way, diode clamping of the inductive kick presented by the motor coils is achieved, without risk of shorting out the motor during other times in the sequence.

DETAILED DESCRIPTION OF THE PREFERRED EMBODIMENT

Figure 3:
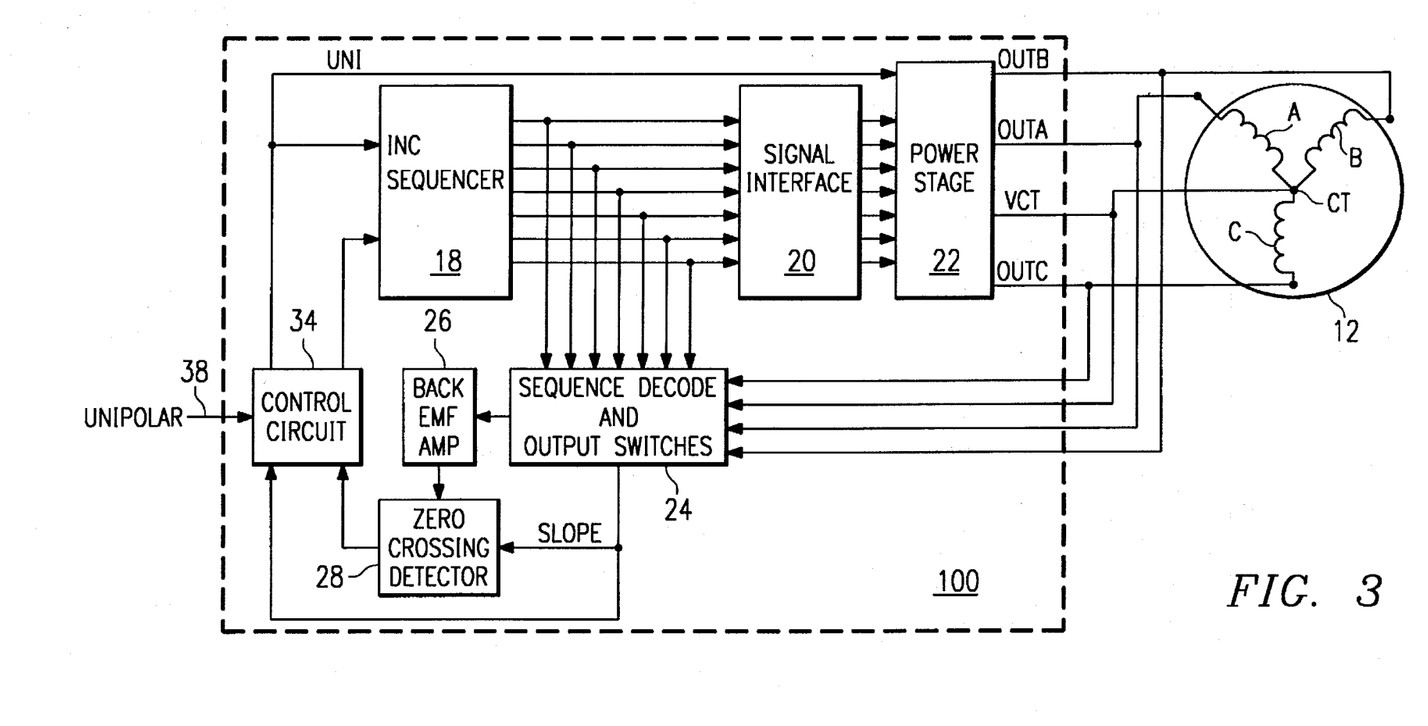
FIG. 3 is an electrical diagram, in block form, of a motor controller and a motor into which the present invention may be incorporated.

FIG. 3 illustrates a simplified electrical schematic block diagram of a system including a motor 12 that is driven by motor controller 100, according to the preferred embodiment of the invention. The diagram of FIG. 3 is simplified to demonstrate underlying principles of motor operation and control, with it understood that one skilled in the art could make various additions or substitutions while still benefitting from the present invention. Additional description of the structure and operation of polyphase DC motors is provided in U.S. Pat. No. 5,306,988, entitled "Method And Apparatus For Operating Polyphase DC Motors," issued Apr. 26, 1994 assigned to SGS-Thomson Microelectronics, Inc., and incorporated herein by reference. For purposes of discussing its operation, motor 12 is illustrated as only including its three stator coils A, B, and C and a center tap CT; it is of course to be understood that various other mechanical and electrical components, such as the motor rotor, will also be included in the system of FIG. 3, in the well-known manner. In addition, while the preferred embodiment of the invention is described with regard to a three phase motor, the principles of the invention can be advantageously applied to polyphase motors in general, and to motors in which the center tap connection is simulated.

In general, the three coils of motor 12 are connected in a "Y" configuration, with the current conducted by each coil controlled by signals from controller 100 at output nodes OUTA, OUTB, and OUTC. The energizing of one or more coils at each instant in time is controlled according to a predetermined commutation sequence; in this example, two such sequences are available, corresponding to a bipolar mode and a unipolar mode. Motor center tap CT is also coupled to controller 100 so controller 100 may measure the potential at center tap CT in bipolar mode, and may provide a biasing signal thereto in unipolar mode. Although not shown, other feedback lines, in addition to those measuring center tap voltage, communicate certain motor parameters back to controller 100.

Motor controller 100 is preferably integrated onto a single microcontroller chip, but could also be constructed using discrete components. Controller 100 includes various components, only some of which are shown in FIG. 3 for purposes of simplicity, and which are illustrated in block fashion to represent the basic functionality of controller 100. Numerous alternative or additional components may be included, such as shown in the above-incorporated patents and patent applications. As shown, controller 100 includes a control circuit 34 which receives various inputs, including feedback data in response to ongoing motor operation, to control the overall operation of controller 100 and in turn the operation of motor 12. For reasons detailed below, control circuit 34 includes a unipolar input 38 for receiving a signal indicating a request for the mode of operation of motor 12 to change from bipolar mode to unipolar mode. While unipolar input 38 of FIG. 3 connotes receipt of an external request signal, the present invention also may be incorporated into a circuit wherein the unipolar mode request is internally generated.

Control circuit 34 is coupled to a bipolar/unipolar sequencer 18. Sequencer 18 outputs control signals so that the coils of motor 12 are selectively energized through a given commutation sequence in the selected one of the bipolar and unipolar modes. In this example, control circuit 34 increments sequencer 18 by way of a signal on line INC so that it moves from phase to phase, each time changing the energy configuration applied to the motor coils to change the magnetic field applied to the motor rotor. Particularly, sequencer 18 outputs a set of control signals to signal interface 20 for each phase of the sequence. Signal interface 20 passes these signals (absent some other command or reason to inhibit the passage of signals) to power stage 22, which includes power components, such as power MOSFETs, for driving the coils A, B, C and center tap CT of motor 12. Accordingly, in each phase of the commutation sequence, the appropriate combination of power (via OUTA, OUTB, OUTC, and in unipolar mode, also VCT) is applied to coils A, B, C of motor 12, to advance the motor rotor in the desired manner.

Selection of the desired commutation mode (i.e., unipolar or bipolar mode) is made by control circuit 34 presenting a unipolar request signal on line UNI to sequencer 18 and to power stage 22. It is preferred to start up motor 12 in bipolar mode, and to then switch to unipolar mode upon motor 12 reaching a certain operating speed, to cut the number of flux linkages in the current path in half, thus reducing back emf and its current limiting effect in the stator. Switching from bipolar to unipolar mode is effected by controller 14 generating a signal UNI to sequencer 18 in response to a request signal at input 38, once motor 12 has reached a certain speed. It has been determined that switching to unipolar mode at certain times may adversely effect the operation of the motor. For example, when the switch from bipolar mode to unipolar mode occurs near a zero-crossing point, a change in the back emf across the stator coil may occur, which could result in a disturbance in the motor sequencing causing a large modulation in motor torque. It is therefore preferred to switch from bipolar mode to unipolar mode at a point in time away from a zero crossing, to reduce the risk of the undesirable results of changing modes near the zero crossing. Since, in this example, zero crossings occur every 60 degrees, it is preferred to switch from bipolar mode to unipolar mode near the midpoint between successive zero crossings, for example at approximately 30 degrees following a zero crossing (which will be 30 degrees before the next expected zero crossing). This switch timing minimizes the effects that a mode change would present if it occurred near a zero crossing point.

In this example, in both unipolar and bipolar mode, the amount of drive applied to motor 12 is controlled according to the drive current being conducted by motor 12. For example, as described in copending application Ser. No. 08/315,924, filed Sep. 30, 1994, entitled "Improved Current Sensing and Control in Brushless DC Motors", assigned to SGS-Thomson Microelectronics, Inc., and incorporated herein by this reference, a current mirror sensing arrangement is preferred so that the available voltage swing is not limited. Alternatively, a current sensing resistor arrangement such as that shown in FIG. 1 may be used. In either case, the drive current conducted by motor 12 is compared against a command input signal, and the drive current is modulated to match the operation of the motor to the command signal.

Controller 100 also controls the operation of motor 12 by feedback of output nodes OUTA, OUTB, OUTC, and VCT to sequence decode and output switches 24. Switches 24 selectively couple these signals to a back emf amplifier 26 for evaluating the back emf of both the floating and non-floating coils of motor 12. Zero crossing detector 28 determines the zero crossing point by comparing the back emf to the center tap voltage (i.e., VCT) and indicating the point in time when the two voltages are equal. The zero crossing point indication is coupled to control circuit 34. Sequence decode and output switches 28 also determine the slope of the back emf for the floating coil during each particular sequence, that is, negative-to-positive-going or positive-to-negative-going. As known in the art, such an indication is used to ensure accuracy of motor operation. For example, the slope indication prevents zero crossing detector 28 from wrongfully responding to a sudden voltage spike as opposed to a true zero crossing event, and is also used in accurately determining motor position. This slope information is also coupled to control circuit 34.

Figure 4:
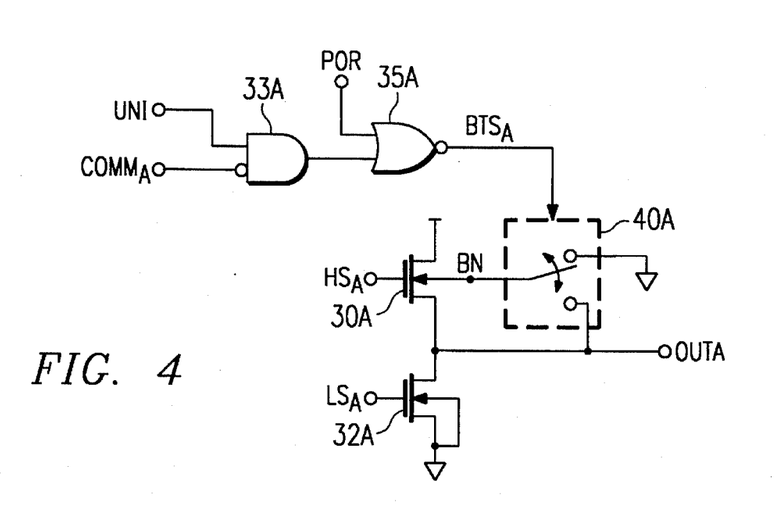
FIG. 4 is an electrical diagram, in schematic form, of a portion of the motor controller of FIG. 3, according to the preferred embodiment of the invention.

Referring now to FIG. 4, a portion of power stage 22 for driving coil A of motor 12, constructed according to the preferred embodiment of the invention, will now be described in detail. The circuitry shown in FIG. 4 for coil A will, of course, be repeated within power stage 22 for coils B and C of motor 12.

As shown in FIG. 3, node OUTA is one of the outputs of power stage 22, and is connected to coil A of motor 12. As shown in FIG. 4, output node OUTA is driven by n-channel high-side drive transistor 30A and by n-channel low-side drive transistor 32A, and as such is connected to the source of transistor 30A and to the drain of transistor 32A. The drain of high-side drive transistor 30A is biased to a high voltage ($V_{cc}$), and its gate is driven by a commutation signal generated by sequencer 18, communicated to transistor 30A on line $HS_A$ from signal interface 20. Similarly, the source of low-side drive transistor 32A is biased to ground, with its gate driven by a commutation signal generated by sequencer 18 and communicated on line $LS_A$ from signal interface 20. According to this embodiment of the invention, the body node of low-side drive transistor 32A is connected to its source, at ground.

Current sensing circuitry may also be implemented in the circuitry of FIG. 4 in the usual manner, such as by way of a sensing resistor placed in the series path between low-side drive transistor 32A and ground. Alternatively, as described in the above-incorporated copending application Ser. No. 08/315,924, filed Sep. 30, 1994, and entitled "Improved Current Sensing and Control in Brushless DC Motors", current mirror sensing may also be used. Such current sensing circuitry, of either type, is not shown in FIG. 4 for purposes of clarity.

In the example of FIG. 4, high-side drive transistor 30A will be disabled in unipolar mode, such that the current through coil A in unipolar mode will be controlled solely by low-side drive transistor 32A. According to the preferred embodiment of the invention, therefore, the body node BN of high-side drive transistor 30A is controlled by switch 40A to be selectively connected to ground or to its source at node OUTA, responsive to a control signal communicated on line $BTS_A$. It is therefore important that transistor 30A be constructed in such a way that its body node may be switchably biased; for example, the transistor construction described hereinabove relative to FIG. 2 may be used for high-side drive transistor 30A according to the preferred embodiment of the invention, except that body node electrode B will not be unconditionally connected to source electrode S, but will instead be controlled in the manner described hereinbelow.

According to this embodiment of the invention, the control signal on line $BTS_A$ is generated responsive to the unipolar request signal generated by controller 34 on line UNI, and to a timing signal generated by sequencer 18 on line $COMM_A$. The signal on line $COMM_A$, as will be described in further detail hereinbelow, is a brief active-high pulse that coincides with the portion of the unipolar commutation cycle during which low-side drive transistor 32A turns off. Line UNI is applied to a non-inverting input of AND gate 33A, and line $COMM_A$ is applied to an inverting input of AND gate 33A.

The output of AND gate 33A is connected to one input of NOR gate 35A which receives, at its other input, a signal on line POR. Line POR communicates a power-on reset pulse (active high) that is generated upon the motor controller integrated circuit containing power stage 20 being initially powered-up. The output of NOR gate 35A drives line $BTS_A$ to control switch 40A.

According to this example, switch 40A is constructed so that it connects body node BN of transistor 30A to its source (node OUTA) when line $BTS_A$ is high, and connects body node BN of transistor 30A to ground responsive to line $BTS_A$ being low. After power-up (i.e., line POR maintained low), the logic function of AND gate 33A and NOR gate 35A will present a low logic level on line $BTS_A$, to connect body node BN to ground, only in unipolar mode (when line UNI is high) and during such times when line $COMM_A$ is at a low logic level; this condition occurs throughout the unipolar commutation sequence except during the commutation time when low-side drive transistor 32A is being turned off, as will be described hereinbelow. During bipolar mode (line UNI low), line $BTS_A$ is forced high, connecting the body node BN of high side drive transistor 30A to its source. During power-on reset (line POR high), line $BTS_A$ is forced low, ensuring that the body node-to-drain diode does not short out motor 12 in the event of high voltage transients that may be produced in power-up.

If current mirror sensing is used for control of motor 12, as described in the above-incorporated copending application Ser. No. 08/3135,924, filed Sep. 30, 1994, entitled "Improved Current Sensing and Control in Brushless DC Motors", the body nodes of any transistors mirroring the current through high-side drive transistors 30 should also be similarly controlled.

Figure 5:
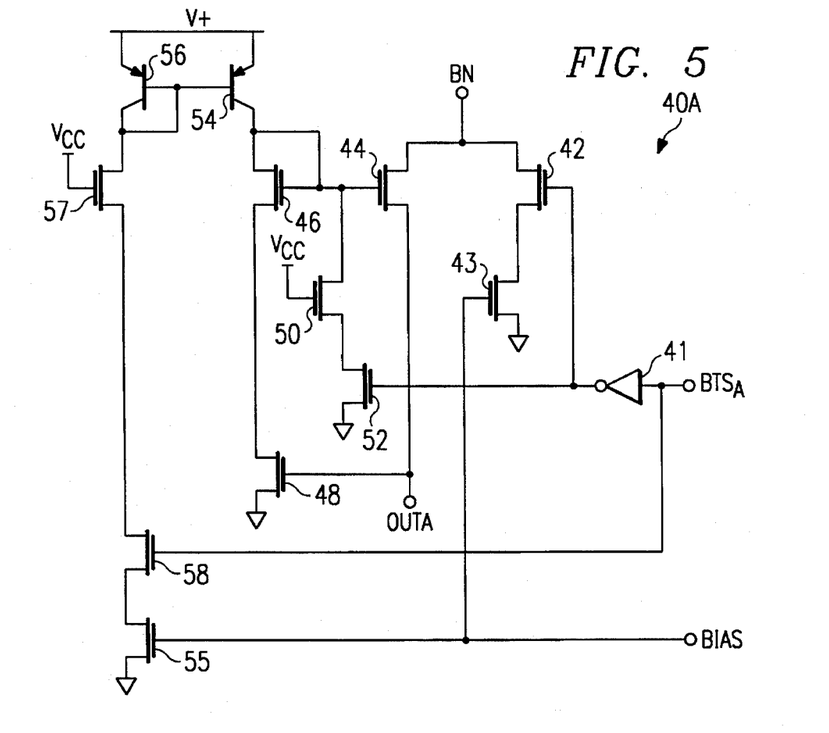
FIG. 5 is an electrical diagram, in schematic form, of switching circuitry for the body node of a high-side drive transistor in the circuit of FIG. 4.

Referring now to FIG. 5, the construction of switch 40A according to the preferred embodiment of the invention will now be described in detail. As noted hereinabove, similar switches 40B, 40C are provided within power stage 22 for control of the body nodes of corresponding high-side drive transistors 30B, 30C. Line $BTS_A$ is received at the input of an inverter 41, the output of which is connected to the gate of n-channel switching transistor 42 (all MOS transistors in this example of switch 40A being of the n-channel type). Switching transistor 42 has its drain connected to body node BN of high-side drive transistor 30A, and has its source coupled to ground through the source/drain path of current source transistor 43. Current source transistor 43 has its gate biased by line BIAS, so that it conducts a specified current from body node BN to ground when switching transistor 42 is turned on by line $BTS_A$ being at a low logic level.

Body node BN is also connected to the drain of switching transistor 44; the source of switching transistor 44 is connected to node OUTA, and thus to the source of high-side drive transistor 30A. Accordingly, when switching transistor 44 is turned on, the body node BN of high-side drive transistor 30A is connected to its source, at node OUTA. The gate of switching transistor is connected, in current mirror fashion, to the gate and drain of transistor 46, which has its source connected to the drain of transistor 48. The source of transistor 48 is connected to ground, and its gate is connected to node OUTA at the source of high-side driver transistor 30A. The gate of switching transistor 44 is also connected to the drain of cascode transistor 50, which has its gate biased to $V_{cc}$; the source of cascode transistor 52 is connected to the drain of transistor 52, which has its source biased to ground and its gate receiving the output of inverter 41.

The gate and drain of transistor 46 (and thus the drain of transistor 50 and the gate of switching transistor 44) are connected to the collector of p-n-p mirror transistor 54, which has its emitter biased to a voltage V+ that is significantly higher than $V_{cc}$ (e.g., on the order of five volts higher). The base of mirror transistor 54 is connected, in current mirror fashion, to the base and collector of p-n-p mirror transistor 56 that also has its emitter biased to V+. The collector of transistor 56 is connected, via the source/drain path of cascode transistor 57 (which has its gate biased to $V_{cc}$), to the drain of transistor 58. Transistor 58 has its source/drain path connected in series with the source/drain path of current source transistor 55, between the collector of transistor 56 and ground. The gate of transistor 58 is connected to line $BTS_A$, and the gate of transistor 55 is connected to line BIAS to conduct the specified current therethrough when transistor 58 is turned on by line $BTS_A$ being at a high logic level.

In operation, switch 40A responds to a high logic level on line $BTS_A$ by transistors 42 and 52 being turned off and transistor 58 being turned on. In this condition, body node BN is disconnected from ground by switching transistor 42 in its off state. With transistor 58 turned on, the current specified by current source transistor 55 is conducted from V+ to ground through transistors 56, 57, 58 and 55. By virtue of the current mirror arrangement between transistors 56 and 54, this current (or a multiple or fraction thereof, depending upon the relative sizes of transistors 54 and 56) is also conducted through transistor 54. Transistor 52, turned off by the high logic level at line $BTS_A$, ensures that the gate of switching transistor 44 is not pulled to ground therethrough. Accordingly, the current mirrored through transistor 54 serves to turn on transistor 44, thus connecting body node BN of high-side transistor 30A to its source at node OUTA, with the remainder of the mirrored current conducted to ground through transistors 46 and 48. The operation of transistors 46, 48 ensure that the voltage at the gate of transistor 44 is clamped to a reasonable voltage, so that transistor 44 may be rapidly turned off at the appropriate time.

A low logic level on line $BTS_A$, produced by NOR gate 35A and indicating that the body node BN of transistor 30A is to be connected to ground rather than to its source at node OUTA, turns on switching transistor 42 via inverter 41, turns off transistor 58, and turns on transistor 52. The turning off of transistor 58 greatly reduces the current through transistor 56, which greatly reduces the mirrored current through transistor 54 and accordingly reduces the drive of the gate of switching transistor 44. With the absence of drive to the gate of switching transistor 44 through transistor 54 and with transistor 52 turned on, the gate of switching transistor 44 is thus rapidly discharged to ground through transistor 50, 52. As a result, switching transistor 44 is rapidly turned off to disconnect the body node BN of high-side drive transistor 30A from its source at node OUTA. Switching transistor 42, turned on by inverter 41, connects body node BN to ground.

Figure 6A:
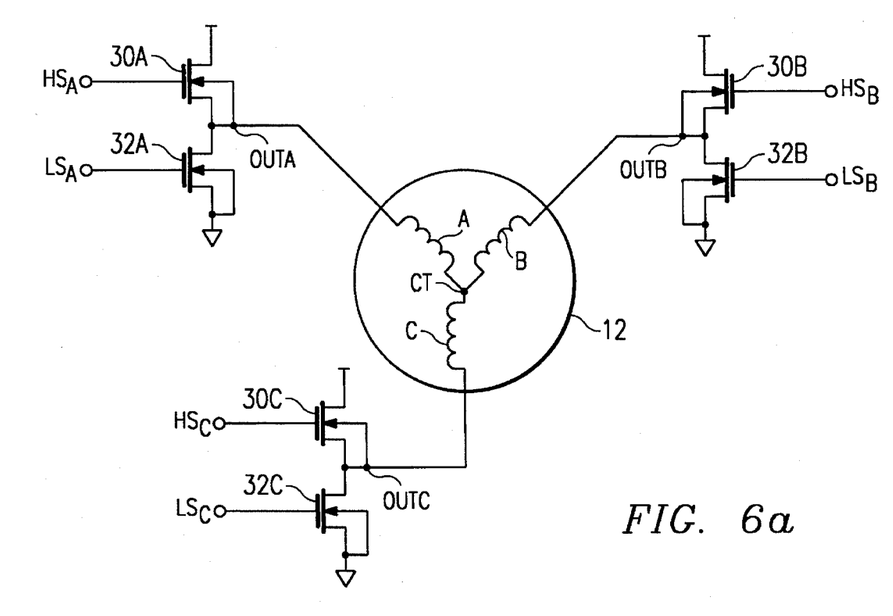
FIG. 6a is an electrical diagram, in schematic form, illustrating the operation of the circuitry of FIGS. 4 and 5 in the bipolar mode.

Referring now to FIG. 6a, the operation of motor 12 by way of a simplified schematic of the power circuitry driving each of the coils of motor 12 in the bipolar mode, will now be described. As in the case of FIG. 1, each of stator coils A, B, and C is driven by corresponding drive transistors 30, 32. As shown in FIG. 6, stator coil A is driven by drive transistors 30A and 32A, coil B is driven by drive transistors 30B and 32B, and stator coil C is driven by drive transistors 30C and 32C.

Each drive transistor pair is coupled to source and sink current in the same general fashion. For example, high side drive transistor 30A is coupled to a source voltage (e.g., $V_{CC}$) while low side drive transistor 32A is coupled to a lower voltage (e.g., ground). While ground is shown as the low side potential, as will be described hereinbelow, additional circuitry is preferably coupled between $V_{CC}$ and transistor 32A to establish the low side potential, so as to limit the current flow without completely grounding transistor 32A. The gates of each transistor 30A, 32A receive drive signals $HS_A$, $LS_A$, respectively, from sequencer 18.

In the bipolar mode, the motor coils are selectively energized such that each current path in the sequence includes two of the three stator coils, while the third coil floats. According to this description, the term "float" corresponds to placing the drive transistors of a coil in a tristate condition. Table 1 below shows the current path in each of the six bipolar mode commutation phases, in sequence.

TABLE 1

| Phase | Current Flows From Coil | To Coil | Floating Coil |
| --- | --- | --- | --- |
| 1 | A | B | C |
| 2 | A | C | B |
| 3 | B | C | A |
| 4 | B | A | C |
| 5 | C | A | B |
| 6 | C | B | A |

Figure 6B:
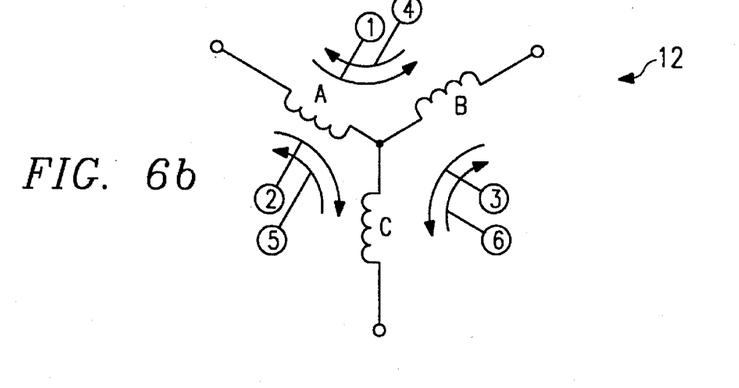
FIG. 6b is a schematic diagram illustrating the current path for the six phases of the bipolar mode.

FIG. 6b illustrates the stator coils of motor 12 and the current path for the six phases of Table 1, with each current path labeled by its respective phase. Thus, FIG. 6b demonstrates that when a floating coil is switched into the current path, current flows through it in the same direction in which it flowed through the coil which was in the path in the immediately preceding phase.

Returning to FIG. 6a, the operation of the transistor pairs to achieve the sequence of Table 1 is now discussed. In phase 1, current flows from coil A to coil B; thus, transistors 30A and 32B are on, while transistors 32A and 30B are off. Consequently, in accordance with the nomenclature defined above, the high side is on for coil A and the low side is on for coil B. In phase 2, again current flows from coil A, but to coil C instead of coil B. Thus, transistors 30A and 32A remain on and off, respectively, but transistor 32B is now turned off to discontinue current flow to coil B, and transistor 32C is turned on to establish the current path through coil C. In other words, the low side of coil C conducts in place of the low side of coil B. This switching operation is generally known as a low side to low side commutation, because the commutation is performed by turning off one low side transistor (e.g., 32B) while turning on another low side transistor (e.g., 32C).

In phase 3, current continues to flow through coil C, but is sourced from coil B instead of coil A, with the high side of coil B conducting instead of the high side of coil A (as was the case in phase 2). This switching operation is generally known as a high side to high side commutation. In phase 4, current continues to source through coil B, but flows to coil A instead of coil C. The commutation from phase 3 to phase 4 switches the low side drive of coil B on and the low side of coil C off, in a low side to low side commutation. The above process continues through all phases of the bipolar sequence of Table 1.

As shown in FIG. 6a, each of high-side drive transistors 30A, 30B, 30C has its body node connected to its source in bipolar mode. This bias condition ensures high performance operation as compared to the case if the body node were instead biased to ground. Furthermore, the energizing of the high-side drive transistors in the bipolar mode preclude problems of shorting out of motor 12, as discussed hereinabove relative to FIGS. 1 and 2.

Figure 7:
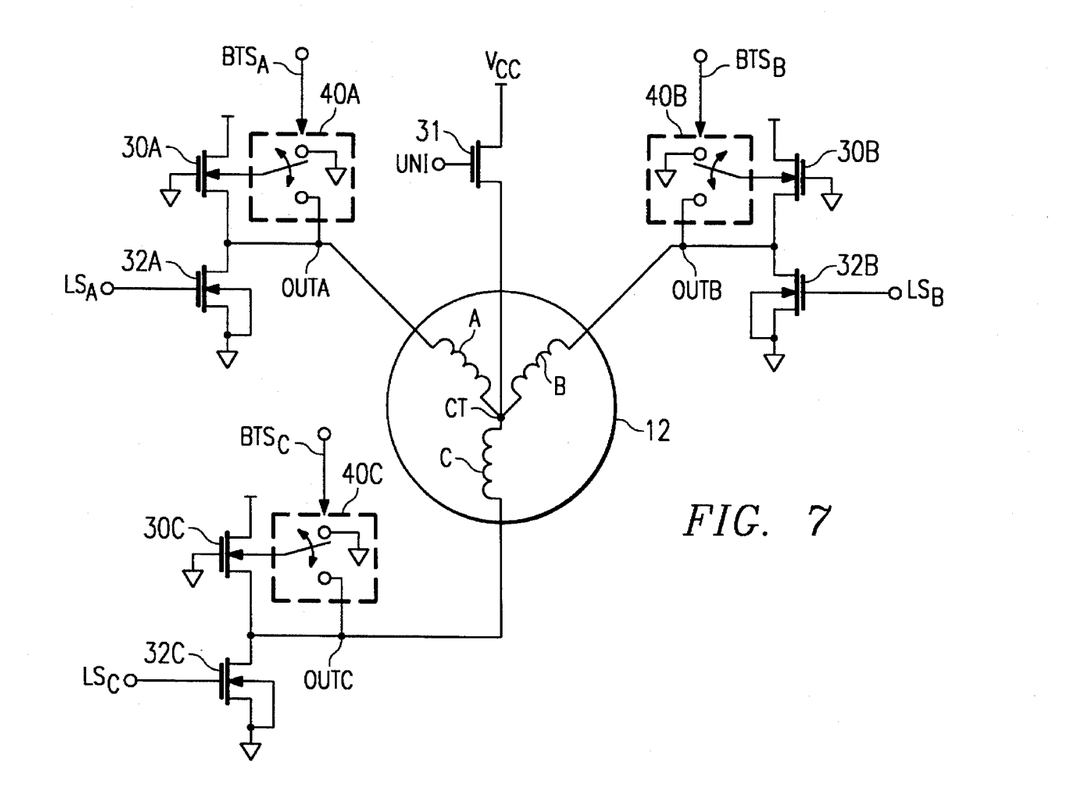
FIG. 7 is an electrical diagram, in schematic form, illustrating the operation of the circuitry of FIGS. 4 and 5 in the unipolar mode.

In unipolar operation, as is well known, a single one of coils A, B, and C is energized in each phase. FIG. 7 illustrates the circuitry of the preferred embodiment of the invention, when configured for operation in unipolar mode. As shown in FIG. 7, a center tap FET 31 is coupled to the center tap node CT of motor 12, and is turned on by a high logic level on line UNI to bias node CT to $V_{cc}$. Each of the high-side drive transistors 30A, 30B, 30C is held off in this mode (their gates held at ground), resulting in a single one of coils A, B, C being energized in each phase as its respective low-side drive transistor 32A, 32B, 32C is turned on. Current is then conducted from $V_{cc}$ to center tap FET 31, through the energized one of coils A, B, C, and through the corresponding low-side drive transistor 32 to the low side potential, which is ground. Alternatively, the opposite polarity of drive current may be effected by connecting center tap FET 31 between center tap CT and ground, in which case the high-side drive transistors 30 would regulate the drive current.

As indicated in FIG. 7, in unipolar mode the body nodes BN of each of high-side drive transistors 30A, 30B, 30C are switched between ground and the source node by switches 40A, 40B, 40C, respectively. The timing of this switching will now be described in detail, relative to FIG. 8.

Figure 8:
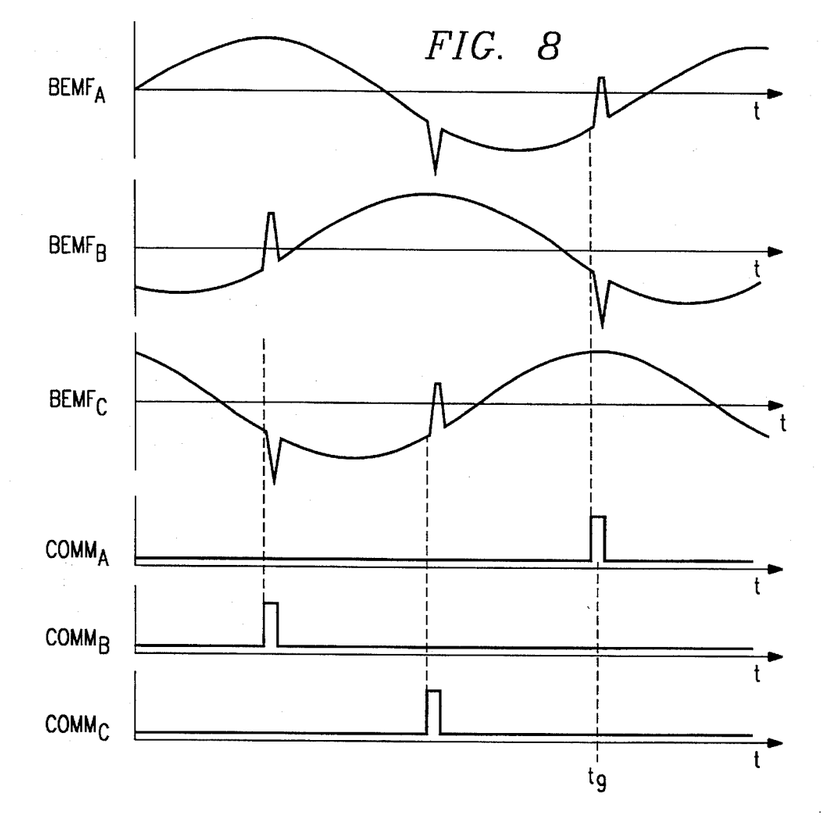
FIG. 8 is a timing diagram illustrating the back emf of the coils in the motor being driven in unipolar mode according to the preferred embodiment of the invention.

FIG. 8 illustrates the back emf voltages $BEMF_A$, $BEMF_B$, $BEMF_C$ for coils A, B, C, respectively, over a commutation cycle in the unipolar mode, for the circuit arrangement according to FIG. 7 in which the low-side drive transistors 32 control the drive current, and in which the high-side drive transistors 30 are held off. As evident from FIG. 8, the back emf voltages $BEMF_A$, $BEMF_B$, $BEMF_C$ are sinusoidal waveforms that are approximately 120° out of phase with one another. In addition, each back emf waveform includes two spikes which correspond to the well-known "inductive kick" occurring upon commutation, both in turn-on and turn-off, of low-side drive transistors 32. In the unipolar arrangement of FIG. 7, the negative-going voltage spike in the back emf waveform for a coil occurs upon the turn-on of its associated low-side drive transistor 32, while the positive-going spike occurs upon the turn-off of the associated low-side drive transistor 32.

FIG. 8 also illustrates the temporal relationship of the signals on lines $COMM_A$, $COMM_B$, $COMM_C$ that control the timing of the generation of the control signals $BTS_A$, $BTS_B$, $BTS_C$ applied to switches 40A, 40B, 40C in FIG. 7, respectively. As described above relative to FIG. 4, a high logic level control signal is generated on lines $COMM_A$, $COMM_B$, $COMM_C$ for a brief time coincident with the turn-off of its associated low-side drive transistor 32A, 32B, 32C. Logic is provided for each of switches 40A, 40B, 40C, in similar manner as that shown in FIG. 5 for switch 40A, to generate low logic levels on lines $BTS_A$, $BTS_B$, $BTS_C$ substantially coincident with the high logic level signals on lines $COMM_A$, $COMM_B$, $COMM_C$ of FIG. 8. At times in the commutation sequence other than during the high level pulses on lines $COMM_A$, $COMM_B$, $COMM_C$, lines $BTS_A$, $BTS_B$, $BTS_C$ respectively, are maintained at high logic levels.

Figure 9:
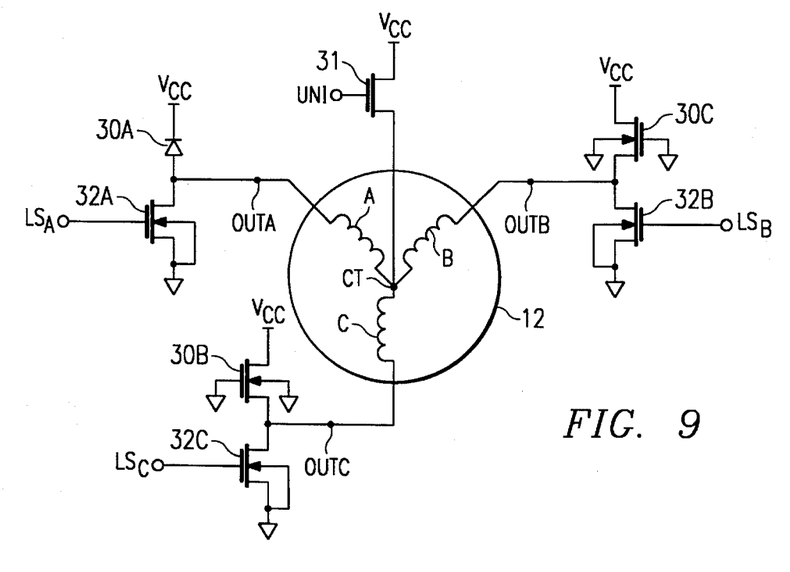
FIG. 9 is an electrical diagram, in schematic form, illustrating the effective circuit of FIG. 7 at a commutation time in the sequence of FIG. 8.

Referring now to FIG. 9, the effective configuration of the motor driver arrangement of FIG. 7 is illustrated at time $t_9$ of FIG. 8, which is during the high logic level pulse on line $COMM_A$. During this time, line $BTS_A$ is at a low logic level responsive to the high logic level on line $COMM_A$, by operation of the circuitry of FIG. 4 for switch 40A. With line $BTS_A$ low, body node BN of high-side drive transistor 30A is connected to the source of transistor 30A at node OUTA. As described above, transistor 30A thus appears to node OUTA as a diode, having its anode connected to node OUTA and its cathode connected to $V_{cc}$; this diode is present between the p-type body node region and the n+ drain of transistor 30A. Accordingly, the back emf is clamped to near $V_{cc}$ by the operation of transistor 30A as a diode during the turn-off commutation period, thus limiting the voltage excursion of the inductive kick on coil A at this time (from that illustrated by the dashed line for $BEMF_A$). This clamping prevents the overvoltage condition presented by the inductive kick of the coil from destroying the output transistors 30A, 32A.

Also at this time, lines $BTS_B$, $BTS_C$ are at a high logic level, since their associated control signals $COMM_B$, $COMM_C$ are at a low logic level. Switches 40B, 40C thus connect the body nodes of transistors 30B, 30C to ground during this time, as shown in FIG. 9. As a result, there is no diode presented by either of transistors 30B, 30C to their nodes OUTB, OUTC, eliminating the possibility of motor 12 shorting out if the back emf voltage for either coil exceeds $V_{cc}$.

The present invention thus provides the important advantage of biasing the body nodes of drive transistors in a motor control circuit at one voltage (e.g., to their source voltage) when activated, such as in bipolar mode, to maximize the performance of the motor control circuit, while biasing the body nodes of these transistors to a safe voltage when otherwise inactivated, such as in unipolar mode. The present invention provides the additional advantage of allowing the body node of the otherwise inactivated transistor to be biased to its source at specific times, such as during commutation, thus clamping inductive kick of the coil to a safe voltage.

It is contemplated that other types and arrangements of motor control circuitry may also benefit from the present invention. For example, the present invention may be applied to a motor control circuit in which, for unipolar mode, the center tap is biased to ground, the low-side drive transistors are inactivated, and the high-side drive transistors alone control commutation. Furthermore, it is contemplated that the present invention may also be implemented on other types of motors, such as voice-coil motors, such implementation being readily apparent to one of ordinary skill in the art having reference to this specification.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A motor control circuit for driving a motor having a plurality of coils, comprising:

a sequencer, for generating drive signals for controlling the drive applied to the plurality of coils according to a unipolar commutation sequence and to a bipolar commutation sequence; and a plurality of output drive circuits, each associated with one of the plurality of coils in the motor, and each comprising:

a first drive transistor, having a source/drain path coupled between a first voltage and an output node coupled to the associated one of the plurality of coils, having a body node connection, having a gate coupled to said sequencer so that said sequencer turns off the first drive transistor in the unipolar mode;

a second drive transistor, having a source/drain path coupled between a second voltage and the output node, and having a gate coupled to said sequencer; and a body node switch circuit for selectably connecting the body node connection of the first drive transistor to a reference voltage in the unipolar mode, and to one end of the source/drain path of the first drive transistor during bipolar mode.

2. The motor control circuit of claim 1, wherein the body node switch circuit connects the body node connection of the first drive transistor to one end of the source/drain path of the first drive transistor during commutation of the second drive transistor in the unipolar mode.

3. The motor control circuit of claim 1, wherein each body node switch circuit comprises:

a switch, having a control input for receiving a switch control signal, for connecting the body node connection of its associated first drive transistor to a reference voltage responsive to the switch control signal being at a first logic level, and for connecting the source of the associated first drive transistor responsive to the switch control signal being at a second logic level; and logic circuitry for generating the switch control signal, having a first input for receiving a unipolar mode signal indicating selection of unipolar mode, and having a second input for receiving a commutation timing signal indicating the time at which the second drive transistor of the one of the plurality of output drive circuits is turned off, so that the logic circuitry generates the switch control signal at its second logic level responsive to the coincidence of the unipolar mode signal and the commutation timing signal.

4. The motor control circuit of claim 3, wherein the logic circuitry generates the switch control signal at its first logic level at times other than the coincidence of the unipolar mode signal and the commutation timing signal.

5. The motor control circuit of claim 3, wherein the logic circuitry has a third input for receiving a power-on reset pulse, and is also for generating the switch control signal at its first logic level responsive to receipt of the power-on reset pulse.

6. The motor control circuit of claim 1, wherein the first and second drive transistors are of the n-channel type.

7. The motor control circuit of claim 6, wherein the source of the first drive transistor is coupled to the output node;

and wherein the body node switch circuit connects the body node connection of the first drive transistor to its source during commutation of the second drive transistor in the unipolar mode.

8. A method for controlling a polyphase DC motor by controlling current conducted by a plurality of coils of the motor, each coil connected on one end to an associated first drive transistor and an associated second drive transistor, each first drive transistor connected between its associated coil and a first voltage, and each second drive transistor connected between its associated coil and a second voltage, comprising the steps of:

commutating the first drive transistors and the second drive transistors in a bipolar mode so that current flows between the first and second voltages through one of the first drive transistors and its associated coil and one of the second drive transistors and its associated coil;

enabling a unipolar mode by biasing a center tap of the motor to a voltage corresponding to the first voltage;

in the unipolar mode, turning off each of the first drive transistors and biasing a body node of each of the first drive transistors to a reference voltage;

commutating the second drive transistors in the unipolar mode so that current flows from the center tap through one of the plurality of coils and its associated second drive transistor; and in the unipolar mode, connecting the body node of one of the first drive transistors to its source at a time corresponding to the commutating of its associated second drive transistor.

9. The method of claim 8, wherein the step of connecting the body node of one of the first drive transistors to its source is performed at a time corresponding to the turning off of its associated second drive transistor.

10. The method of claim 8, further comprising:

during the commutating the first drive transistors and the second drive transistors in a bipolar mode, for each of the second drive transistors, connecting its body node to its source.

11. The method of claim 8, wherein the first and second drive transistors are of the n-channel type.

12. The method of claim 8, further comprising:

powering up an integrated circuit containing the first and second drive transistors;

during the powering up step, connecting the body nodes of the first drive transistors to the reference voltage.

13. A motor system, comprising:

a DC polyphase motor, having a plurality of coils;

a sequencer, for generating drive signals for controlling the drive applied to the plurality of coils according to a unipolar commutation sequence and to a bipolar commutation sequence; and a plurality of output drive circuits, each associated with one of the plurality of coils, and each comprising:

a first drive transistor, having a source/drain path coupled between a first voltage and an output node coupled to the associated one of the plurality of coils, having a body node connection, having a gate coupled to said sequencer so that said sequencer turns off the first drive transistor in the unipolar mode;

a second drive transistor, having a source/drain path coupled between a second voltage and the output node, and having a gate coupled to said sequencer; and a body node switch circuit for selectably connecting the body node connection of the first drive transistor to a reference voltage in the unipolar mode, and to one end of the source/drain path of the first drive transistor in the bipolar mode.

14. The system of claim 13, wherein the plurality of coils in the motor are connected in a Y configuration.

15. The system of claim 14, further comprising:

a center tap drive transistor, for connecting a center tap of the motor to a voltage corresponding to the first voltage in the unipolar mode.

16. The system of claim 13, wherein the body node switch circuit connects the body node connection of the first drive transistor to one end of the source/drain path of the first drive transistor during commutation of the second drive transistor in the unipolar mode.

17. The system of claim 13, wherein each body node switch circuit comprises:

a switch, having a control input for receiving a switch control signal, for connecting the body node connection of its associated first drive transistor to a reference voltage responsive to the switch control signal being at a first logic level, and for connecting the source of the associated first drive transistor responsive to the switch control signal being at a second logic level; and logic circuitry for generating the switch control signal, having a first input for receiving a unipolar mode signal indicating selection of unipolar mode, and having a second input for receiving a commutation timing signal indicating the time at which the second drive transistor of the one of the plurality of output drive circuits is turned off, so that the logic circuitry generates the switch control signal at its second logic level responsive to the coincidence of the unipolar mode signal and the commutation timing signal.

18. The system of claim 17, wherein the logic circuitry generates the switch control signal at its first logic level at times other than the coincidence of the unipolar mode signal and the commutation timing signal.

19. The system of claim 17, wherein the logic circuitry has a third input for receiving a power-on reset pulse, and is also for generating the switch control signal at its first logic level responsive to receipt of the power-on reset pulse.

\* \* \* \* \*